(12) United States Patent
Wei

(10) Patent No.: US 9,431,532 B1
(45) Date of Patent: Aug. 30, 2016

(54) SYSTEM AND METHOD FOR FABRICATING HIGH VOLTAGE POWER MOSFET

(71) Applicant: PowerWyse, Inc., San Jose, CA (US)

(72) Inventor: Tao Wei, Los Gatos, CA (US)

(73) Assignee: PowerWyse, Inc., San Jose, CA (US)

( * ) Notice: Subject to any disclaimer, the term of this patent is extended or adjusted under 35 U.S.C. 154(b) by 0 days.

(21) Appl. No.: 14/844,669

(22) Filed: Sep. 3, 2015

Related U.S. Application Data

(60) Provisional application No. 62/116,086, filed on Feb. 13, 2015.

(51) Int. Cl.
| | |
|---|---|
| *H01L 29/78* | (2006.01) |
| *H01L 29/08* | (2006.01) |
| *H01L 29/10* | (2006.01) |
| *H01L 29/06* | (2006.01) |
| *H01L 29/40* | (2006.01) |
| *H01L 29/861* | (2006.01) |
| *H01L 27/06* | (2006.01) |

(52) U.S. Cl.
CPC ....... *H01L 29/7835* (2013.01); *H01L 27/0629* (2013.01); *H01L 29/063* (2013.01); *H01L 29/0649* (2013.01); *H01L 29/0684* (2013.01); *H01L 29/0847* (2013.01); *H01L 29/1095* (2013.01); *H01L 29/405* (2013.01); *H01L 29/7818* (2013.01); *H01L 29/861* (2013.01)

(58) Field of Classification Search
CPC .............. H01L 29/06–29/064; H01L 29/404; H01L 29/7835; H01L 29/7818; H01L 29/405; H01L 29/0684
See application file for complete search history.

(56) References Cited

U.S. PATENT DOCUMENTS

| | | | |
|---|---|---|---|
| 4,754,310 A | 6/1988 | Coe | |
| 5,216,275 A | 6/1993 | Chen | |
| 5,438,215 A | 8/1995 | Tihanyi | |
| 5,689,144 A * | 11/1997 | Williams | H01L 29/0847 307/130 |
| 5,760,440 A * | 6/1998 | Kitamura | H01L 27/0922 257/328 |
| 6,717,230 B2 | 4/2004 | Kocon | |
| 8,592,906 B2 | 11/2013 | Darwish et al. | |
| 2010/0314681 A1* | 12/2010 | Hsieh | H01L 24/05 257/328 |
| 2013/0032895 A1* | 2/2013 | Disney | H01L 29/7835 257/409 |

* cited by examiner

*Primary Examiner* — Dale E Page
*Assistant Examiner* — John Bodnar
(74) *Attorney, Agent, or Firm* — SV Patent Service

(57) ABSTRACT

A high voltage power MOSFET includes a semiconductor substrate doped by a first conducting type, a source doped by a second conducting type and over the semiconductor substrate, and a drain region doped by the second conducting type and on the semiconductor substrate. One or more drain layers doped by the second conducting type and on the semiconductor substrate span between the body region and the drain region. An insulating layer is formed on at least a portion of the body region and over the one or more drain layers. A voltage regulating layer on the insulating layer can produce voltage distributions in the one or more drain layers to deplete charge carriers to increase blockage voltage in an off state, and to accumulate charge carriers in an on state to reduce on-state resistance.

13 Claims, 12 Drawing Sheets

SYSTEM AND METHOD FOR FABRICATING HIGH VOLTAGE POWER MOSFET

BACKGROUND OF THE INVENTION

This application relates to semiconductor devices, and more particularly, to high voltage power metal-oxide-semiconductor field-effect transistors (MOSFET).

One of the most important components in a high voltage semiconductor power MOSFET is the lightly doped drain (LDD) region (also known as "drift" region). While LDD helps a device supporting high applied voltage during the voltage blocking "off" state, it also heavily limits the current conductivity during "on" state then current is conducting. In a conventional high voltage power MOSFET, due to the LDD resistance, the total on-resistance ($R_{on}$) rapidly increases with the desired reverse breakdown voltage ($V_b$). The relationship can be roughly expressed as a function of $R_{on} \sim V_b^3$. For example, in a 750V conventional vertical MOSFET, the LDD contributes almost 99% of the device's total on-resistance.

There have been a few methods developed over the years to reduce the on-resistance. They help continually driving down device unit area on-resistance, or specific on-resistance. Most methods attempt to increase LDD doping density for a given reverse breakdown voltage. One of the examples is reduced surface field (RESURF), which utilizes partial charge compensation or conductor field plates to reduce peak electrical field, it allows a higher total LDD doping profile to be used (J. A. Appels and H. M. J. Vaes, HV Thin Layer Devices (RESURF Devices), Proc. Intl. Electron Devices Meeting, pp. 238-241, 1979). Another method introduces the so-called charge balance (CB) to help deplete LDD before its breakdown (Coe, U.S. Pat. No. 4,754,310A; Chen, U.S. Pat. No. 5,216,275; and Tihanyi, U.S. Pat. No. 5,438,215). Charge balance method has been mainly used in vertical MOSFET and over the years it has gradually reduced specific on-resistance. The RESURF and field control methods are more widely used in lateral MOSFET that allow easy integration with lower voltage devices. Over the years, they have gradually evolved into so-called multiple RESURF by combining charge balance effects. Charge balance and multiple RESURF are currently producing the best specific on-resistance $R_s$ in integrated MOSFET. They rely on columns of P and N type materials that deplete each other when biased into off-state. In general, doping density, and thus conductivity, can be increased when column width is reduced. But they are relatively difficult to mass produce, due to the difficulty in both column width and doping density control, especially the latter that requires P and N types be closely matched. Due to these limitations, multiple RESURF method finds only limited use in production.

In pursuing the same goal of more effectively depleting LDD, other field manipulating techniques have been proposed. But in general, they are much less successful. For example, in Kocon, U.S. Pat. No. 6,717,203, bias electrodes disposed adjacent the drift (LDD) region to alter the electric field in the drift region to increase reverse breakdown voltage. This approach is relatively complex, and the extra controlling terminals make it difficult to be implemented in applications. In Darwish, U.S. Pat. No. 8,592,906, capacitively coupled floating electrodes in LDD provide a similar means to deplete the LDD with increasing applied voltage, but it has the disadvantage of not being stable enough due to the presence of floating components.

There is therefore a need for an improved advanced on art to have an improved semiconductor high voltage power MOSFET that is simple to implement and provides control stability.

SUMMARY OF THE INVENTION

The present invention pertains to high voltage semiconductor power MOSFET devices. In the present disclosure, reverse breakdown voltage for such devices can be increased by embedding electrical field in the LDD region while maintaining relatively high conductivity. A control mechanism of embedding structures also allows LDD to be driven into accumulation in on-state, which results in significant on-resistance reduction. At off-state, a current conducting path above or surrounding LDD region, between the MOSFET drain and source, provides a stable embedded electrical field depleting charge carriers from the LDD region. The conducting path is separated from the LDD region by a thin layer of insulating dielectric material. During the voltage blocking period, or off-state, a small current flows through the path, being resistors or junction devices, provides a stable potential distribution and embedded electrical field depleting the LDD region of charge carriers. The depletion in turn enhances the blocking voltage. The path can be adjusted to produce a desired off-state electrical field distribution within LDD and optimize blocking voltage. The depletion effect allows the use of an extra optional thin layer of conductive material (extra LDD doping) near the surface to enhance device conductivity in on-state mode. The embodiments can also be manipulated to further significantly improve conductivity by biasing LDD into accumulation during on-state. As accumulation normally increases carrier density a few orders of magnitude, the on-resistance is significantly reduced.

The current conducting path in present invention can be a resistive material, or a series planar junction diodes connected in series, controlled by the MOSFET source and drain. Some disclosed devices have the path controlled by MOSFET gate and can be biased in accumulation in conduction mode, which results in significant on-resistance reduction.

One advantage of present invention is that the disclosed devices can be extended to three-dimensional embodiments. In addition to the above mentioned one-dimensional depletion effect, a three-dimensional structure also depleted laterally by the two side conducting paths. For the conducting paths using diodes, the depletion during off-state and accumulation during on-state are enhanced when the distances between adjacent two diodes are reduced. It is thus can be scaled with technology progress. With progress in semiconductor process technology, the semiconductor dimensions could be reduced and conductivity increased.

In one general aspect, the present invention relates to a high voltage power MOSFET that includes a semiconductor substrate doped by a first conducting type; a source doped by a second conducting type and over the semiconductor substrate; a drain region doped by the second conducting type and on the semiconductor substrate; one or more drain layers doped by the second conducting type and on the semiconductor substrate, wherein the one or more drain layers span between the body region and the drain region, wherein doping levels in the source and in the drain region are at least an order of magnitude higher than doping levels in the body region and the one or more drain layers; a body region doped by the first conducting type and configured to separate the source from the one or more drain layers and the drain region; an insulating layer formed on at least a portion of the body region and over the one or more drain layers; a voltage regulating layer on the insulating layer and configured to produce voltage distributions in the one or more drain layers to deplete charge carriers to increase blockage voltage in an off state, and to accumulate charge carriers in an on state to reduce on-state resistance. The voltage regulating layer can include a resistive layer or a layer of serially connected P-N junctions; and a gate on the insulating layer and at least in part over the source.

Implementations of the system may include one or more of the following. The insulating layer can be on and covers the section of the body region that is sandwiched between the source and the one or more drain layers. Doping levels in the source and in the drain region can be at least two orders of magnitude higher than doping levels in the body region and the one or more drain layers. Doping levels in the source and in the drain region can be at least an order of magnitude higher than doping levels in the semiconductor substrate. The first voltage regulating layer can include a resistive layer, wherein the resistive layer can include a first end electrically connected with the source and a second end electrically connected with the drain region. The first voltage regulating layer can include a resistive layer, wherein the resistive layer can include a first end electrically connected with the gate and a second end electrically connected with the drain region. The first voltage regulating layer can include a resistive layer, wherein the resistive layer includes a first end electrically connected with the gate and a second end, wherein the high voltage power MOSFET can further include a P-N junction diode connected between the second side of the resistive layer and the drain region. The first voltage regulating layer can include a layer of serially connected P-N junctions. The layer of serially connected P-N junctions can include multiple pairs of P-N junctions connected back-to-back. The layer of serially connected P-N junctions can include a first end electrically connected with the source and a second end electrically connected with the drain region. The layer of serially connected P-N junctions can include a first end electrically connected with the gate and a second end electrically connected with the drain region. The layer of serially connected P-N junctions can include multiple serially connected uni-directional P-N junctions. The layer of serially connected P-N junctions can include a first end electrically connected with the gate and a second end, wherein the high voltage power MOSFET can further include: a P-N junction diode connected between the second end of the layer of serially connected P-N junctions and the drain region. The voltage regulating layer can include a first layer of serially connected P-N junctions, wherein the high voltage power MOSFET can further include: one or more second layers of serially connected P-N junctions connected in parallel to the first layer of serially connected P-N junctions, wherein the first layer of serially connected P-N junctions and the one or more second layers of serially connected P-N junctions can produce voltage distributions in the one or more drain layers to deplete charge carriers to increase blockage voltage in an off state, and to accumulate charge carriers in an on state to reduce on-state resistance. The voltage regulating layer can include a layer of at least two serially connected P-N junctions that are connected in parallel with each other, wherein the at least two serially connected P-N junctions can produce voltage distributions in the one or more drain layers to deplete charge carriers to increase blockage voltage in an off state, and to accumulate charge carriers in an on state to reduce on-state resistance. Each of the at least two serially connected P-N junctions can include multiple serially connected uni-directional P-N junctions. Each of the at least two serially connected P-N junctions can include multiple pairs of P-N junctions connected back-to-back. The first conducting type can be P type, wherein the second conducting type is N type, wherein the high voltage power MOSFET is a high voltage N-type power MOSFET. The first conducting type can be N type, wherein the second conducting type is P type, wherein the high voltage power MOSFET is a high voltage P-type power MOSFET.

These and other aspects, their implementations and other features are described in details in the drawings, the description and the claims.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1:
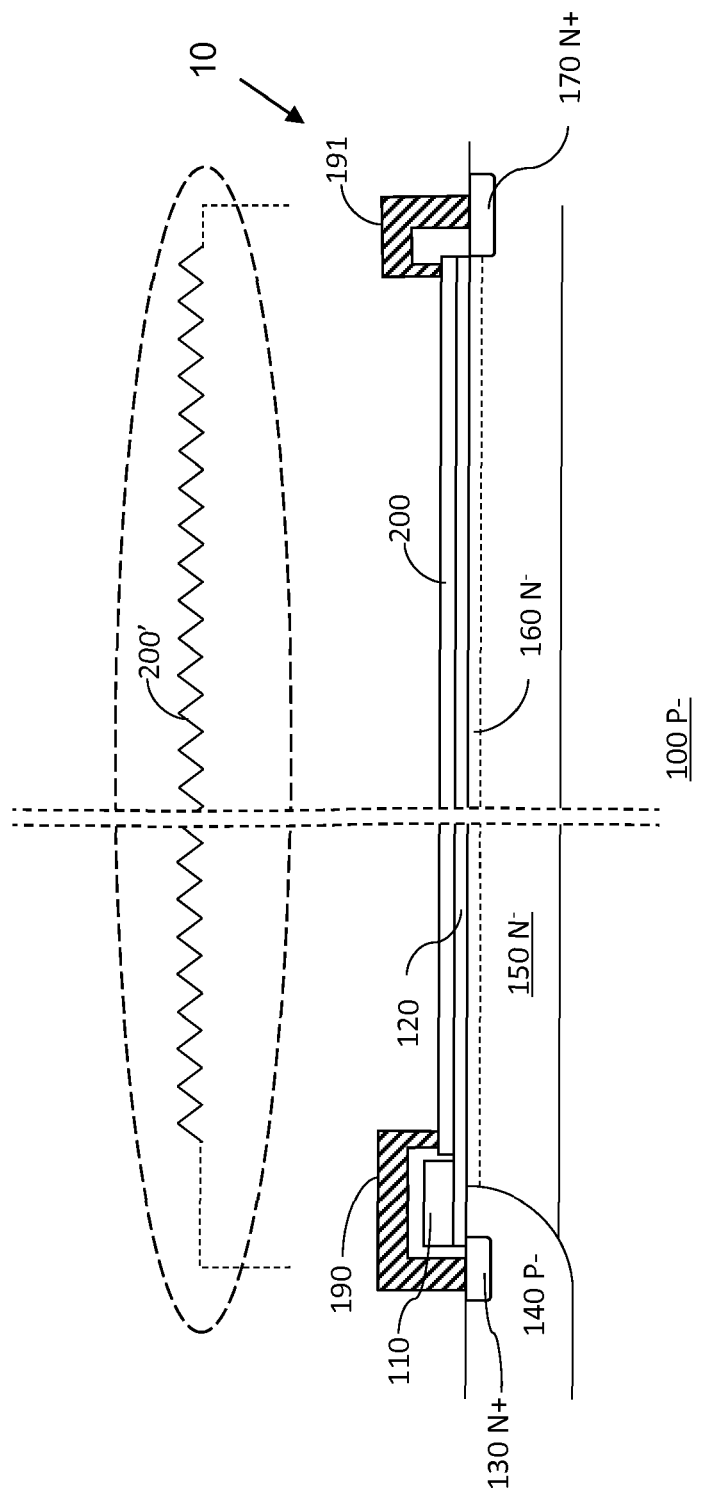
FIGS. 1-3 are circuit diagrams of high voltage power MOSFETs comprising a resistive layer to provide voltage distributions to reduce on-state resistance in accordance with some embodiments of the present invention.

Referring to FIG. 1, a high voltage N-type power MOSFET 10 includes a lightly P⁻ doped semiconductor substrate 100, and a heavily N⁺ doped source 130 and a heavily N⁺ doped drain region 170 in the lightly P⁻ doped semiconductor substrate 100. An N-type lightly doped drain (LDD) layer 150 that spans between the N⁺ doped drain region 170 and a P-type body region 140 adjacent to the heavily N⁺ doped source 130 in supporting applied high voltage. An optional thin N-type lightly doped drain (LDD) layer 160 can be formed on the LDD layer 150. The P-type body region 140 isolates the N⁺ doped source 130 from the LDD layer 150/160 and the N⁺ doped drain region 170.

In some embodiments, the doping levels in the N⁺ doped source 130 and in the N⁺ doped drain region 170 are at least one order magnitude higher than doping levels in the P-type body region 140 and the one or more N-type doped drain layers 150/160. In some embodiments, the doping levels in the N⁺ doped source 130 and in the N⁺ doped drain region 170 are at least two orders of magnitude higher than doping levels in the P-type body region 140 and the one or more N-type doped drain layers 150/160.

The doping level for the LDD layer 150 can vary from material to material, for example, $\leq 10^{17}/cm^3$ in Silicon, but can be different in other materials. The doping level for the heavily doped N⁺ source 130 and the N⁺ doped drain region 170 can be in a range $>1 \times 10^{19}/cm^3$ in Silicon.

In the present disclosure, the higher doping regions such as the N³⁰ doped source 130 and the N⁺ doped drain region 170 are denoted as N⁺, which in silicon can have doping range of $\sim 10^{19}$-$10^{20}/cm^3$ in silicon. The P-type body region 140 can have a doping range of $\sim 10^{17}$-$10^{18}/cm^3$ in silicon. The N⁻ lightly doped drain (LDD) layers 150, 160 has a doping level range of $\sim 10^{15}$-$10^{18}/cm^3$ in silicon. The lightly P⁻ doped semiconductor substrate 100 has a doping level range of $10^{14}$-$10^{17}/cm^3$ in silicon.

In some embodiments, the lightly P⁻ doped semiconductor substrate 100 have doping level similar to or lower than those in the P-type body region 140 and the one or more N-type doped drain layers 150/160. In other words, the doping levels in the N³⁰ doped source and in the N⁺ doped drain are at least two orders of magnitude higher than doping levels in the P-doped semiconductor substrate.

An insulating layer 120 is formed on at least a portion of the P-type body region 140 and on the LDD layer 160 and on or over the LDD layer 150. Specifically, the insulating layer 120 is on and covers the section of the P-type body region 140 that is sandwiched between the N⁺ doped source 130 and the one or more N-type doped drain layers 150/160.

An electrode gate 110 on the insulating layer 120, over the P-type body 140 and at least in part over the source 130 provides a mean to control the conductivity of the MOSFET. When a positive voltage is applied to the gate 110, the top layer of P-type body region 140 is inverted to N-type, generating a conducting channel between the source 130 and the LDD layer 150 and the N⁺ doped drain region 170 and the device is operated in on-state. Setting gate 110 voltage to zero turns it into off-state, with which a high voltage can be applied.

The presently disclosed high voltage N-type power MOSFETs includes a voltage regulating layer that can produce voltage distributions in the one or more N-type lightly doped drain layers to deplete charge carriers to increase blockage voltage in an off state, and to accumulate charge carriers in an on state to reduce on-state resistance. The voltage regulating layer can include a resistive layer or one or more layers of serially connected P-N junctions.

In some embodiments, a resistive layer 200 made of highly resistive material is formed on the LDD layer 150 and over the insulating layer 120. Conductors 190, 191 at the N⁺ doped drain region 170 and the source 130. The equivalent circuit for the resistive layer 200 is shown in the dashed circle on the top portion of FIG. 1, which includes a distributive resistor 200' having its two ends connecting to the conductors 190, 191. At the off-state, a small current flowing through the distributive resistor 200' generates a gradually decreasing voltage above the LDD layer 150, which forces an evenly distributed electrical field on LDD layer 150 that depletes the charge carriers in LDD layer 150, which prevents a premature breakdown. Here the resistive layer 200 is to be maintained at a high resistive value and thin thickness, so the current is below the limits required by specific applications. The depletion allows the higher doped LDD layer 150 to support an applied voltage higher than it normally can. The optional conducting layer LDD layer 160 below the resistive layer 200 and the insulating layer 120 can be easily depleted thoroughly and should not affect the breakdown voltage. The higher doping levels in the LDD layer 150 and extra doping from the LDD layer 160 result in a higher conductivity at the on-state. To effectively deplete LDD layers 150 and 160, the voltage distribution is very critical. The resistive layer 200 adequately provides a desired voltage distribution.

It should be noted that although high voltage N-type power MOSFETs have been described above and below, the present invention is compatible with P-type high voltage power MOSFETs, which can be implemented by reversing the doping polarities of the semiconductor substrate, the body region, the source, the drain region and the drain layers, etc. from the disclosed examples. Various regions and layers in the N-type power MOSFETs are doped by two conducting types: N-type and P-type. In the P-type power MOSFETs, the conducting types in the corresponding regions and layers are switched.

Figure 2:
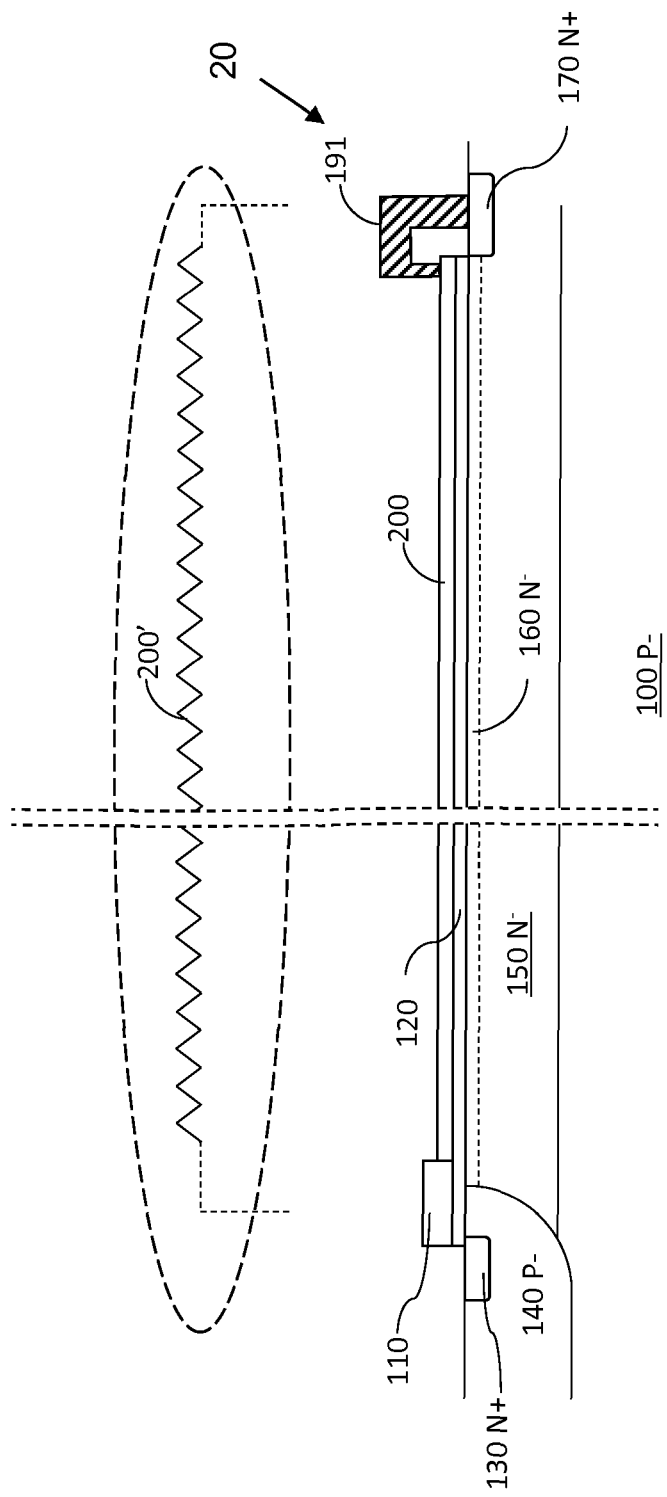

In some embodiments, referring to FIG. 2, a high voltage N-type power MOSFET 20 includes some components similar to those in the high voltage N-type power MOSFET 10 in FIG. 1 except for the resistive layer 200 is electrically connected to the N⁺ doped drain region 170 and the gate 110. The high voltage N-type power MOSFET 20 operates similar to the high voltage N-type power MOSFET 10 at off-state, but quite differently in on-state. At the off-state, small current flows through the resistive layer 200 and forces an evenly distributed electric field on the LDD layer 150 (and 160) that depletes the charge carrier, which in turn prevents a premature breakdown. In the on-state, a gate bias is applied to both the gate 110 and the resistive layer 200. This applied gate bias voltage gradually decreases in the resistive layer 200 from the gate 110 to the N⁺ doped drain region 170. Because of this gradually decreasing voltage distribution is immediately above isolation layer 120, the LDD layers 150 and 160 are biased into charge-carrier accumulation mode, with sections near the gate 110 heavily accumulated and sections near the N⁺ doped drain region 170 lightly accumulated. With charge-carrier accumulation within LDD layers 150 and 160, the carrier density is significantly increased, especially near the gate 110 where carrier density can be orders of magnitude higher. As a result, conductivity is significantly increased and the device on-state resistance reduced. The equivalent circuit of resistive material for the resistive layer 200 is shown in dashed circle in the top portion of the FIG. 2.

Figure 3:
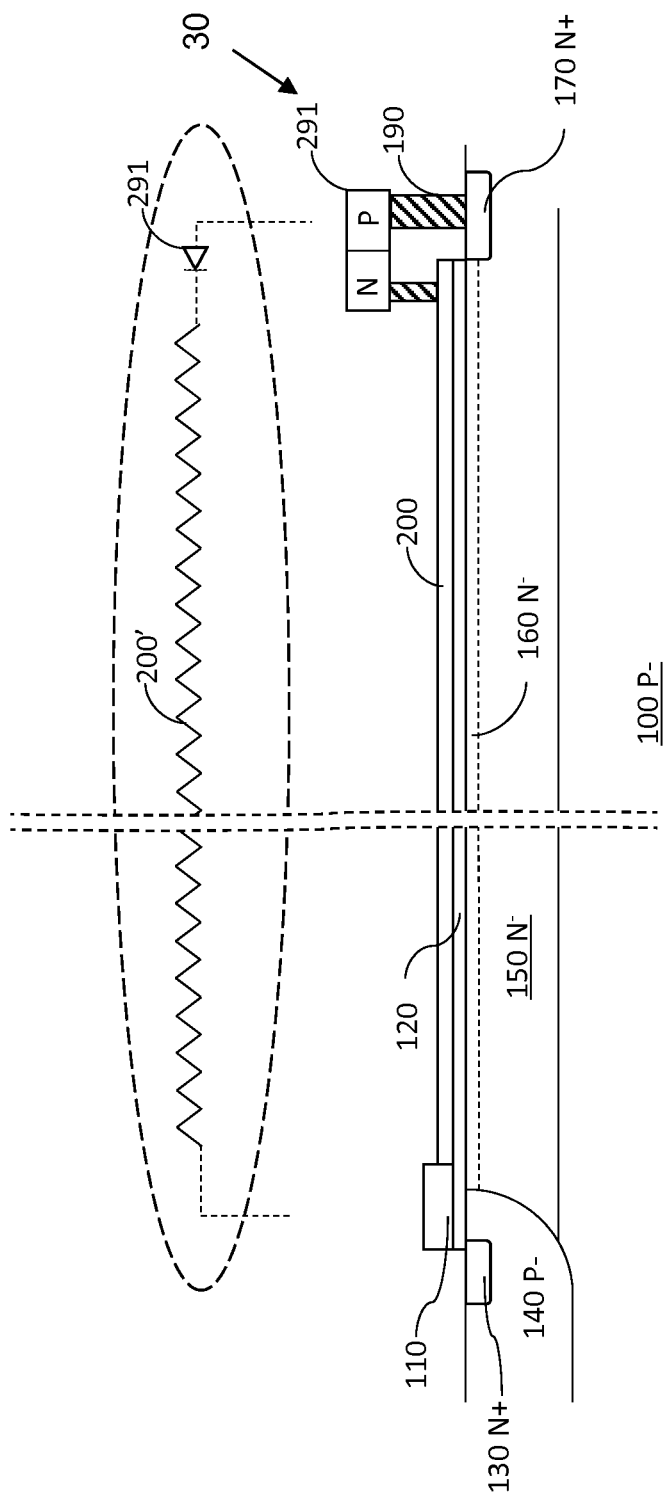

Similarly, referring to FIG. 3, a high voltage N-type power MOSFET 30 is similar to the high voltage N-type power MOSFET 20 (FIG. 2). A P-N junction diode 291 with reverse breakdown voltage higher than the normal gate bias is inserted between the resistive layer 200 and the N+ doped drain region 170. The high voltage N-type power MOSFETs 20 and 30 operate similarly at the off-state. During the on-state, the whole resistive layer 200 attains the same voltage as the gate 110 because it is isolated by the diode 291 from the N+ doped drain region 170. With the full gate voltage applied to the resistive layer 200, the LDD layers 150 and 160 are biased into heavy accumulation, in which carrier density is normally increased by several orders of magnitude and on-resistance is significantly reduced. The equivalent circuit, which is an addition to a conventional high voltage power MOSFET, is shown in dashed circle in the top portion of FIG. 3.

Figure 4:
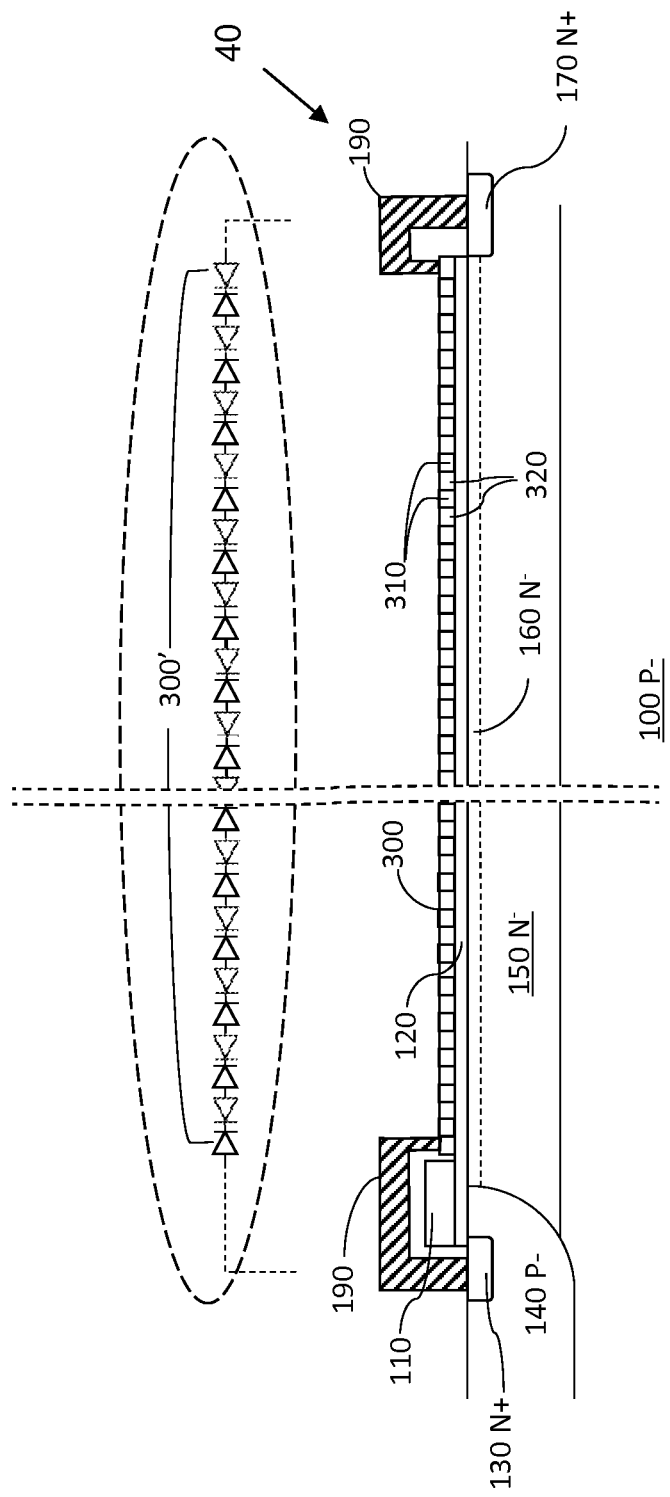
FIGS. 4-5 are circuit diagrams of high voltage power MOSFETs comprising a layer of serially back-to-back connected P-N junctions for reducing on-state resistance in accordance with some embodiments of the present invention.

In some embodiments, referring to FIG. 4, a high voltage N-type power MOSFET 40 includes some components similar to those in the high voltage N-type power MOSFET 10 (FIG. 1) except for that the resistive layer 200 on the insulating layer 120 is replaced by a series of planar P-N junctions 300 comprising a series of P sections 310 and N sections 320. The equivalent circuit for planar P-N junctions 300 is shown on the top in the dashed circle, in which a series of diodes 300' representing P-N junctions have their two ends connected to the source 130 and the N+ doped drain region 170.

The series of planar P-N junctions 300 is set to have a total breakdown voltage equal to or slightly lower than that of underlying device. With current flowing through P-N junctions between drain and source prior to breakdown, a gradually step-down potential and a relatively evenly distributed electrical field is obtained, which in turn depletes LDD region at off-state and support high applied voltage.

The P-N junctions 300 allow much lower off-state current, which is desirable in most applications. On the other hand, its induced field distribution is less uniform than that in FIG. 1. However, so long as the P sections 310 and the N sections 320 are small enough and the insulating layer 120 properly chosen, the voltage distribution can provide an adequate field that effectively depletes the LDD layers 150 and 160 and supports a high voltage. In some embodiments, all junction diodes 300' are substantially identical. The total junction breakdown is set to be lower or equal to the designed MOSFET breakdown. According to the equivalent circuit, too high a breakdown voltage for the diodes 300' could result in a higher than necessary voltage accumulation near the N+ doped drain region 170, which may generate an undesired field spike. The planar junction diode 300 can be formed by crystalline or non-crystalline materials. For non-crystalline junction diodes like amorphous or polycrystalline silicon or other semiconductor materials diodes, relatively high leakage current provides a current path similar to the resistive layer 200 in the high voltage N-type power MOSFET 10 (FIG. 1). In these cases, the above mentioned diode breakdown voltage limitation can be relaxed.

Figure 5:
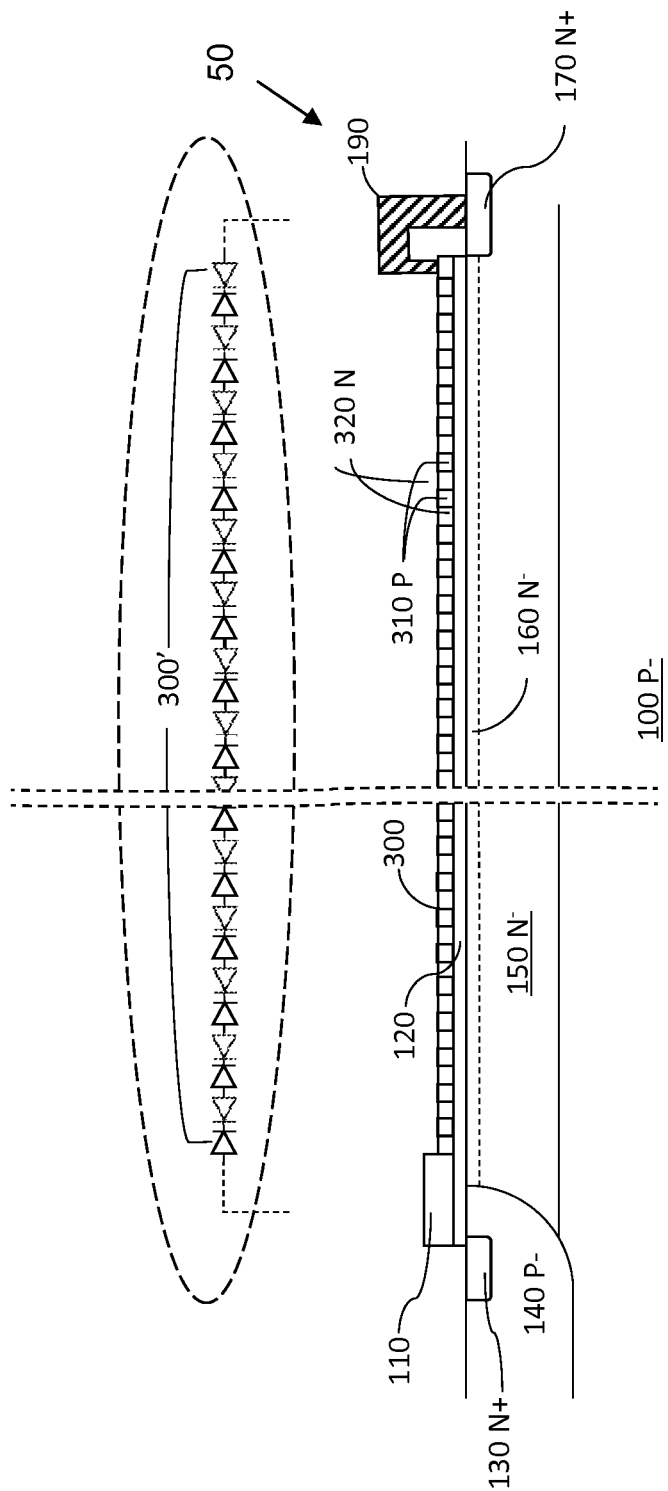

In some embodiments, referring to FIG. 5, a high voltage N-type power MOSFET 50 includes some components similar to those in the high voltage N-type power MOSFET 20 (FIG. 2) except for that the resistive layer 200 on the insulating layer 120 is replaced by a series of planar P-N junctions 300 comprising a series of P sections 310 and N sections 320. The series of planar P-N junctions 300 is electrically connected to the gate 110 at one end and the N+ doped drain region 170 at the other end.

The planar P-N junction series is set to have a total breakdown voltage equal or slightly lower than that of underlying device. At off-state, small current flows through the series of planar P-N junctions 300 prior to breakdown, which produces a gradually step-down potential and a relatively evenly distributed electrical field in the LDD layer 150 (and 160) and depletes the charge carriers therein, which in turn prevents a premature breakdown. During the on-state, the planar P-N junctions 300 near the gate 110 attain some finite potential (i.e. higher-than-zero voltage), which can bias part of the LDD layers 150/160 near the gate 110 into accumulation and enhance conductivity. Shown on top (in dashed circle) is the equivalent circuit of serial planar P-N junctions.

Figure 6:
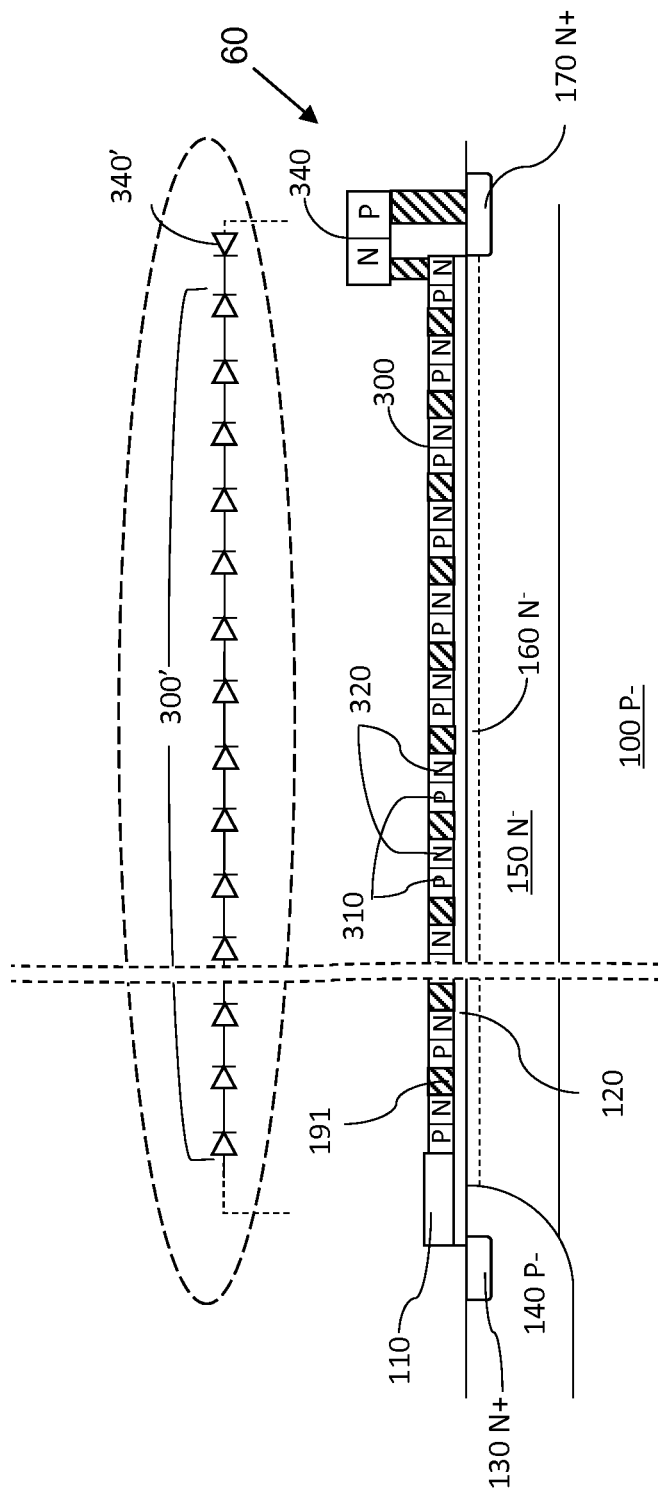
FIG. 6 is a circuit diagram of a high voltage power MOSFET comprising a layer of serially connected uni-directional P-N junctions for reducing on-state resistance in accordance with some embodiments of the present invention.

To make the on-state conductivity more effective, referring to FIG. 6, a high voltage N-type power MOSFET 60 includes a series of uni-directional planar P-N junctions 300 comprising a series of P sections 310 and N sections 320. In the equivalent circuit above, a series of diodes 300' arranged in the same forward direction. A diode 340 representing a P-N junction is reversely connected with the end of the series of diodes 300' and the N+ doped drain region 170. The diode 340' is set to have a reverse breakdown voltage higher than normal gate bias voltage. In this circuit configuration, assuming the diodes 300' are ideal with zero forward voltage, all diodes 300' attain the same voltage as the gate 110 during on-state. With a fully gate voltage applied over the insulating dielectric layer 120, the LDD layers 150 and 160 are biased into heavy carrier accumulation, in which LDD carrier density is increased by several orders of magnitude and on-resistance is significantly reduced. The equivalent circuit for the layer of uni-directional P-N sections is shown on top in dashed circle.

In reality, all diodes have a finite forward voltage drop. At on-state, the voltage for a diode that is n diodes away from the gate 110 is $V_g$-$nV_{df}$, where $V_g$ is the applied gate voltage and $V_{df}$ is the forward voltage drop for the diodes 300'. Those diodes 300' far away from the gate 110 receive very low or no bias. So this configuration is limited to cases of low count of diodes 300, which likely is limited to relatively lower voltage applications. For example, in silicon (Si), P-N junction diode $V_{df}$ is close to 0.7 V, for a typical gate bias voltage of 20V, n has to be less than 20 to ensure at least 6V on all diodes.

Figure 7:
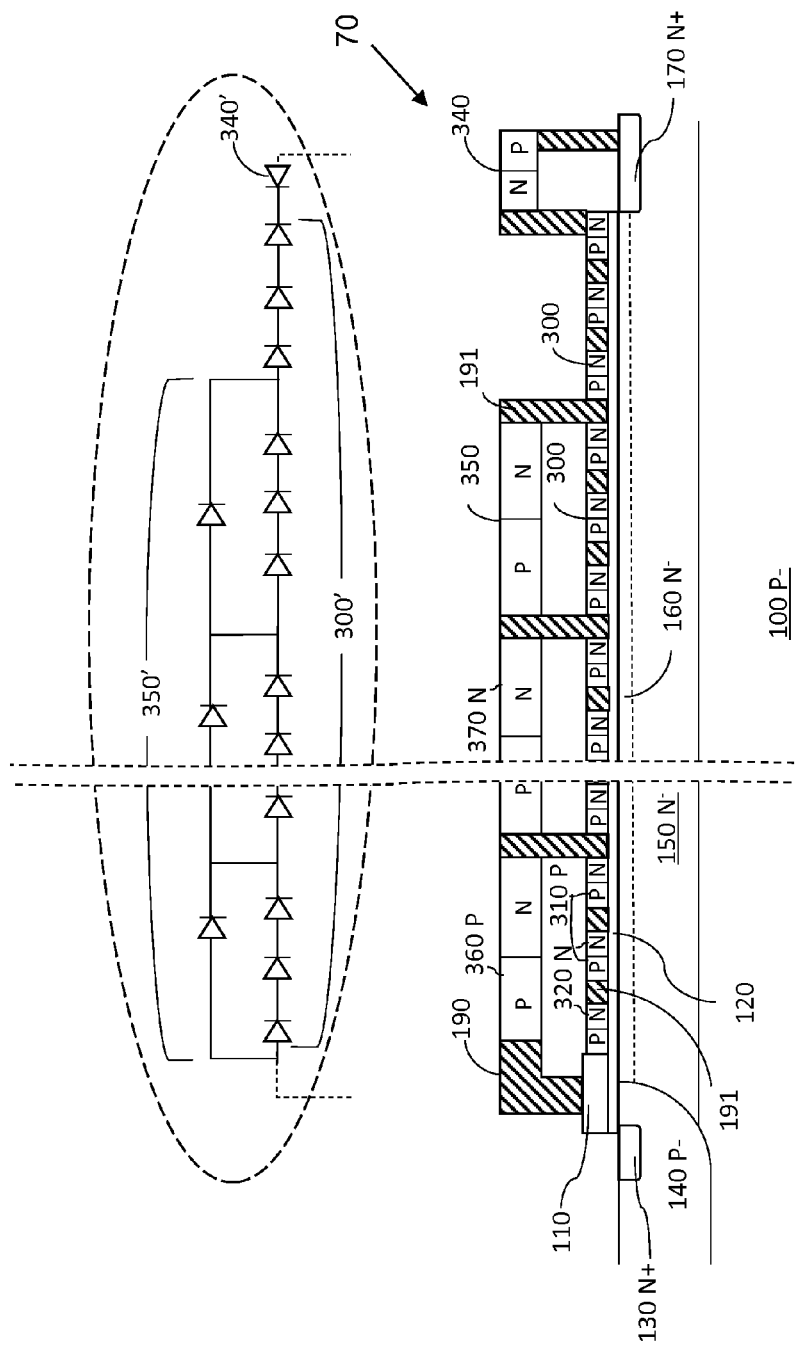
FIG. 7 is a circuit diagram of a high voltage power MOSFET comprising two layers of serially connected uni-directional P-N junctions to provide voltage distributions to reduce on-state resistance in accordance with some embodiments of the present invention.

FIG. 7 shows another high voltage N-type power MOSFET 70 that includes a series of uni-directional planar P-N junctions 300 comprising a series of P sections 310 and N sections 320, and in addition, a second layer of diodes 350 on the series of uni-directional planar P-N junctions 300. The diodes 350 are formed with different P sections 360 and N sections 370 which have a reverse breakdown voltage higher than the summation of the reverse breakdown voltage of the respective diodes 300 under each diode 350. At one end, the series of uni-directional planar P-N junctions 300 and the second layer of diodes 350 on top are both connected to the gate 110 via the conductor 190. The second layer of diodes 350 can be formed only on a portion of the series of uni-directional planar P-N junctions 300 such that the other end of the second layer of diodes 350 is connected to a uni-directional planar P-N junction 300 underneath via a conductor 191. The equivalent circuit for the two layers of diodes is shown on top in dashed circle.

When operated in off-state, a current flows through diodes 300' to provide the necessary voltage and field distributions for depleting charge carriers in the LDD layers 150 and 160. When operated in on-state, applied gate voltage $V_g$ is fed through diode 350' to diodes 300' that are far away from gate 110. As forward voltage $V_{df}$ are the same for the diodes 350' and the diodes 300', by by-passing the underlying diodes 300', n and $nV_{df}$ are reduced, sufficiently high voltages are applied to the diodes 300' under the diodes 350' far from the gate 110 and effective accumulation can be produced.

Referring to FIG. 7, two layers of planar diodes are used to form the equivalent circuit for producing the voltage distribution. Similar to configurations shown in FIGS. 9 to 12, other multiple-layer configurations can be compatible with the present disclosed power MOSFET devices. These multiple-layer approaches will require additional production steps and have extra cost associated with it. One of the solutions is to rearrange them into a single layer.

Figure 8:
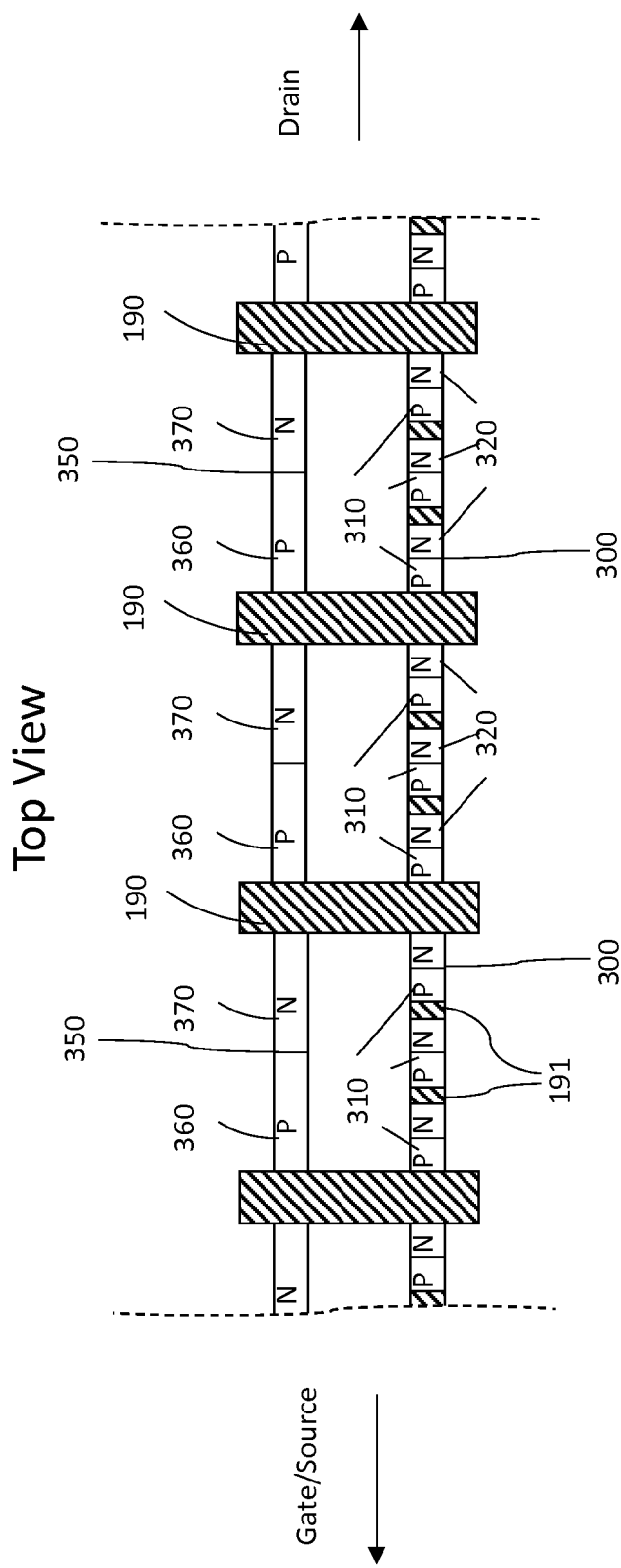
FIG. 8 is a partial top view of two series of uni-directional P-N junctions in parallel formed in a layer to provide voltage distributions to reduce on-state resistance in a high voltage power MOSFET in accordance with some embodiments of the present invention.

While the high voltage N-type power MOSFET 70 include two layers of uni-directional diodes for producing voltage distribution. The two series of uni-directional P-N sections can also be formed in a single layer in parallel to provide the necessary voltage distribution for depleting charge carriers. Referring to FIG. 8, the uni-directional P-N sections 300 and 350 are laid out side by side in a same layer on the insulating layer 120 and the LDD layers 150 and 160. The electrical connections and operations are similar to those multi-layer serially connected P-N sections as shown in FIG. 7.

The additional cascaded diodes 350' in FIGS. 7 and 8 produce a gate bias feeding path to diodes 300' for on-state operation. For devices of very high reverse breakdown voltages, a large number of the diodes 300' are needed. The presently disclosure provides several circuit layouts which can reduce the number of diodes in the secondary series, as shown in FIGS. 9 to 12. The Equivalent circuits shown in FIGS. 9 to 12 are compatible with multiple layers of serially connected P-N sections (in analogy to FIG. 7), or multiple serially connected P-N sections in parallel in a single layer (in analogy to FIG. 8), over the insulating layer 120 and the LDD layers 150 and 160.

Figure 9:
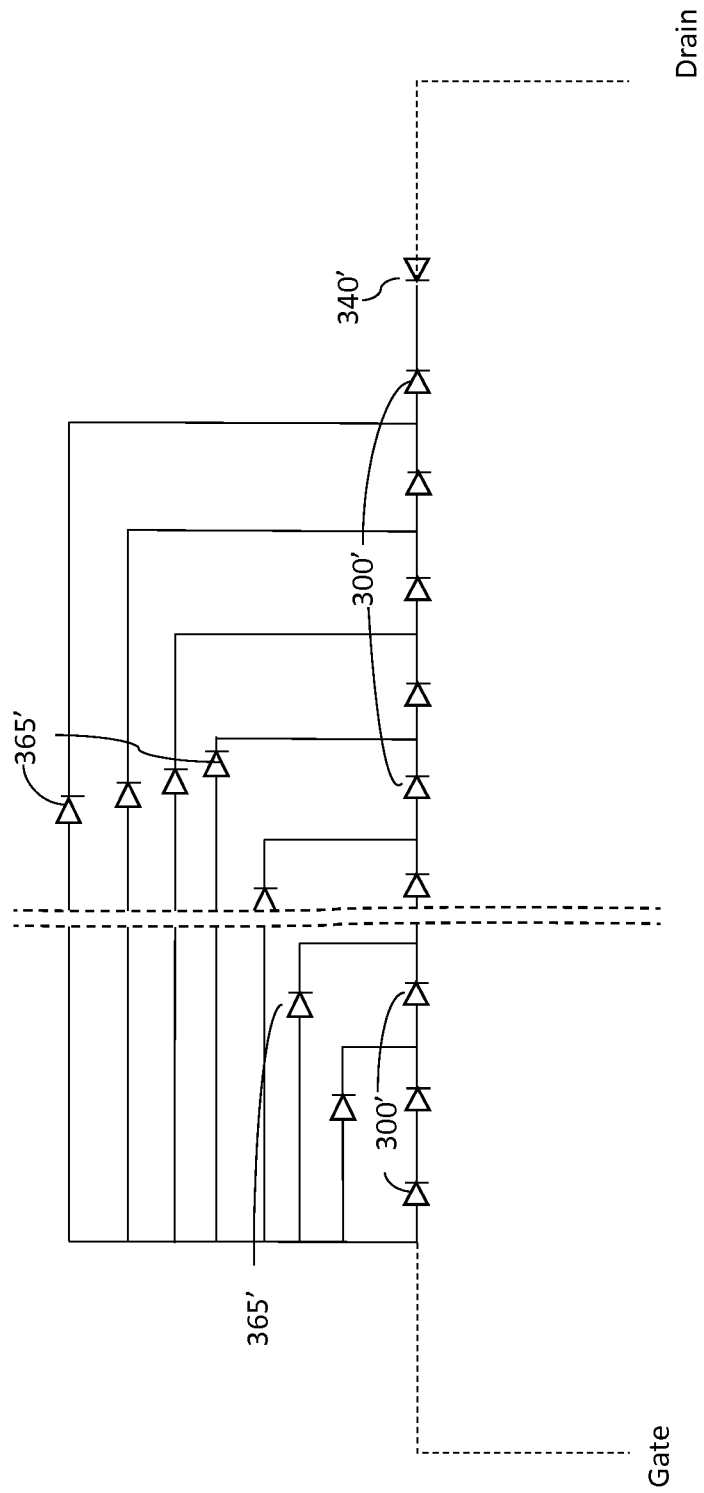
FIGS. 9 to 12 are exemplified equivalent circuits to perform similar functions to the two serially connected P-N sections in FIGS. 7 and 8 to provide voltage distributions to reduce on-state resistance in a high voltage power MOSFET in accordance with some embodiments of the present invention.

In FIG. 9, each node between diode 300' is connected individually by a diode 365' to the gate 110. Here, the reverse breakdown voltages of upper diode 365' can be the same or higher than the total breakdown voltage of underlying diodes 300'. The diode 340' is set to have a reverse breakdown voltage higher than normal gate bias voltage. The desired voltage distribution in off-state is obtained through the bottom line of diodes 300', with the upper diodes 365' for gate bias at on-state only. At the on-state, all diodes 300' receive almost the same voltage as the gate 110 voltage and very effectively bias the LDD layers 150/160 into charge carrier accumulation.

Figure 10:
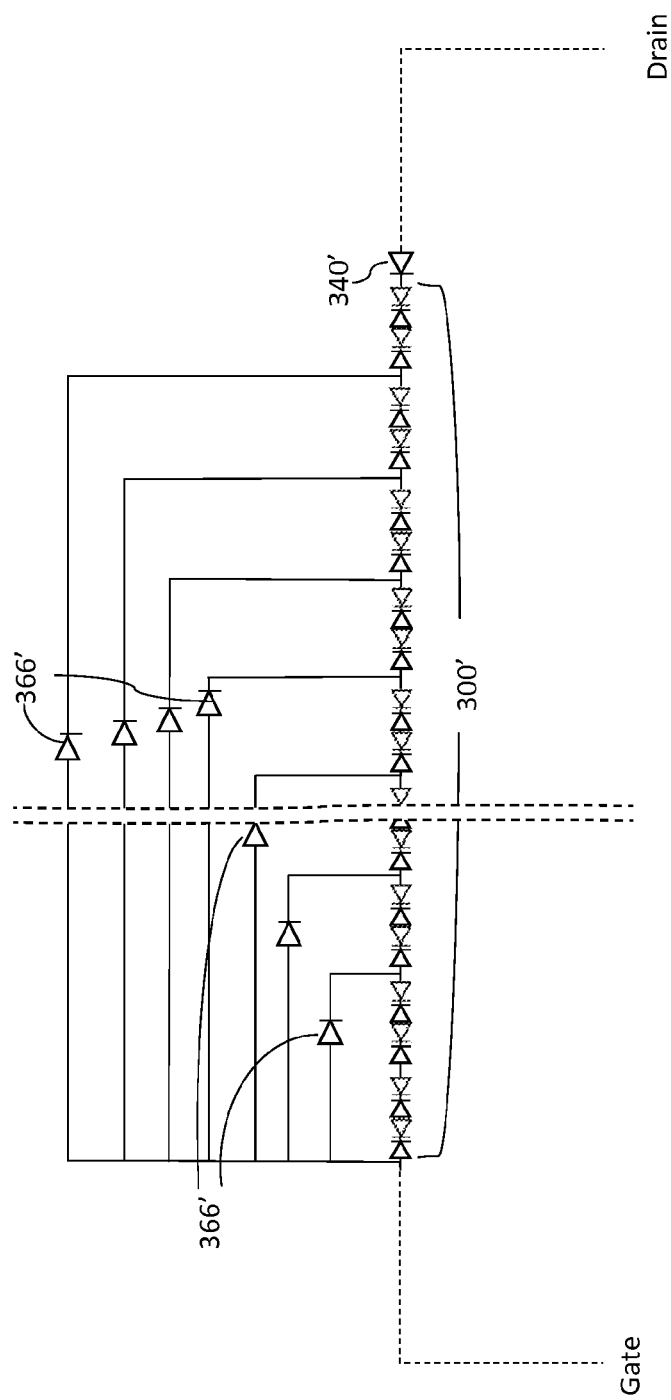

Similarly, referring to FIG. 10, a series of diodes 300' are connected back-to-back. Several upper diodes 366' are connected in parallel with the back-to-back connected diodes 300'. This is especially useful for production as connecting metal between diodes 300' is omitted. The upper diode 366' can have a same or higher breakdown voltage than the total breakdown voltage of underlying diodes 300'. The diode 340' is set to have a reverse breakdown voltage higher than normal gate bias voltage. The desired voltage distribution in off-state is obtained through the bottom line of diodes 300', with the upper diodes 366' for gate bias at on-state only. At the on-state, all diodes 300' receive almost the same voltage as the gate 110 voltage and very effectively bias the LDD layers 150/160 into charge carrier accumulation.

Figure 11:
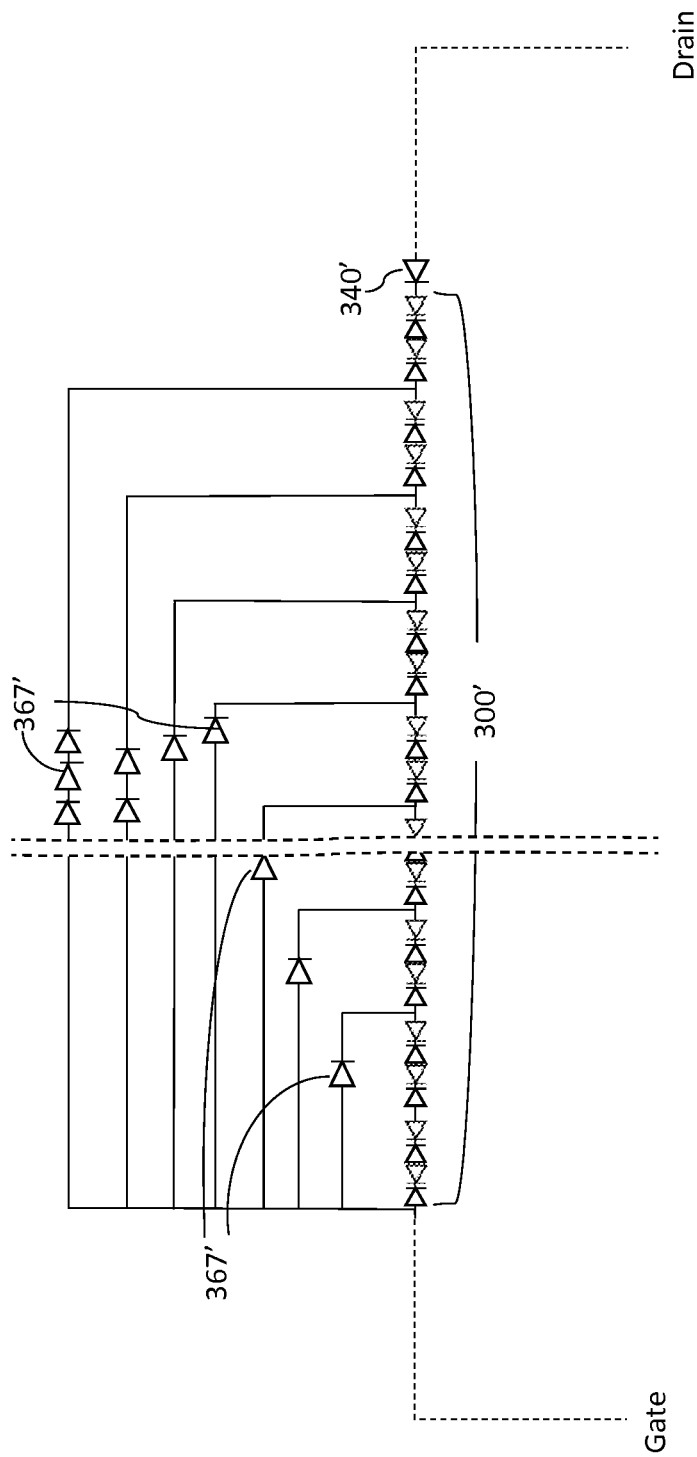

FIG. 11 is similar to FIG. 10, but with more than one upper diode 367' is cascaded for some diodes 300' far from the gate 110. This circuit layout allows the usage of diodes 367' of lower reverse breakdown voltages and helps reducing the diode types needed to build the structure, which is important in designs and production as it simplifies the production process. Here, the total reverse breakdown voltages of multiple upper diode 367' can be the same or higher than the total breakdown voltage of underlying diodes 300'. The diode 340' is set to have a reverse breakdown voltage higher than normal gate bias voltage. The desired voltage distribution in off-state is obtained through the bottom line of diodes 300', with the upper diodes 367' for gate bias at on-state only. At the on-state, all diodes 300' receive sufficiently high voltage and very effectively bias the LDD layers 150/160 into charge carrier accumulation. This cascaded upper diode 367' can also be applied to the cases of FIG. 9 of unidirectional diodes 300'.

Figure 12:
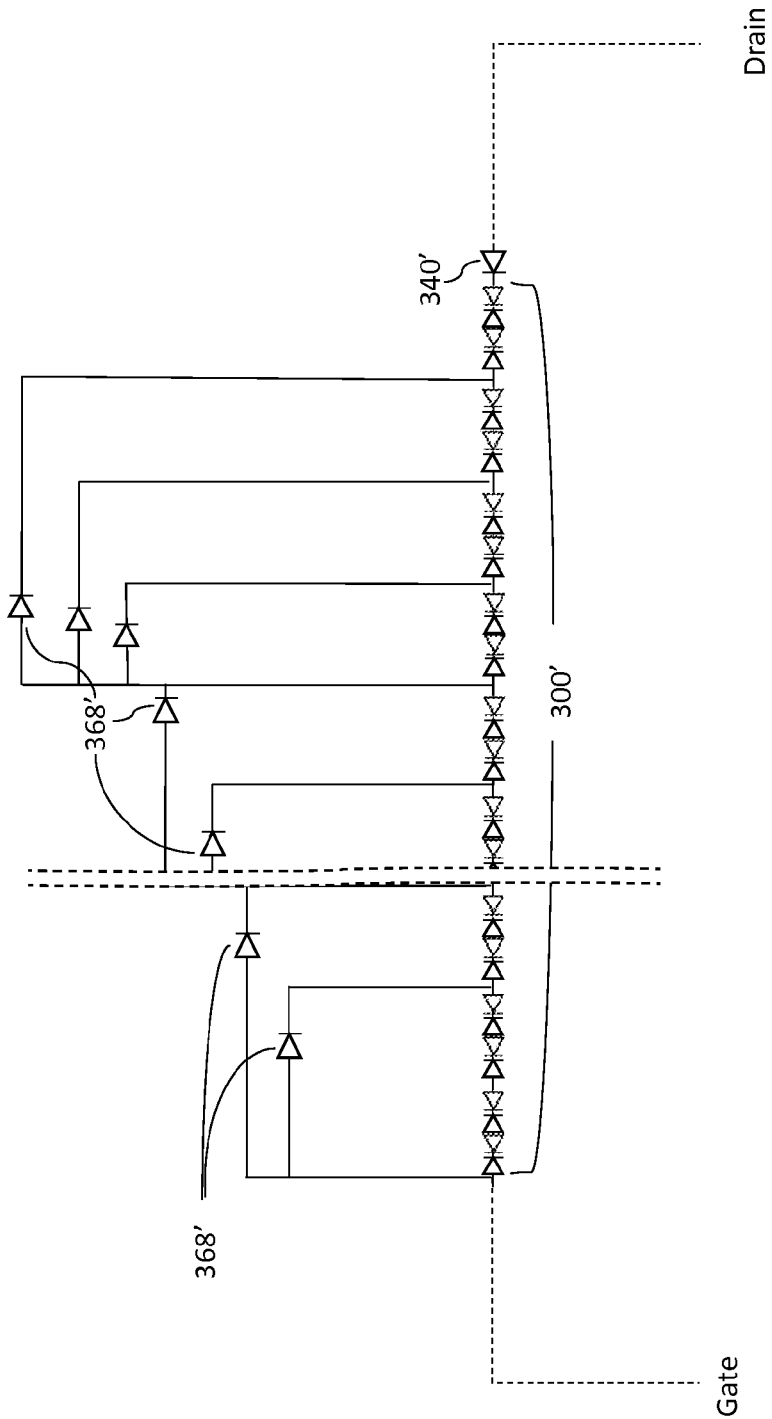

FIG. 12 is similar to FIG. 11, except for some upper diodes 368' are connected in series. Here, the total reverse breakdown voltages of serial upper diode 368' can be the same or higher than the total breakdown voltage of underlying diodes 300'. The diode 340' is set to have a reverse breakdown voltage higher than normal gate bias voltage. The desired voltage distribution in off-state is obtained through the bottom line of diodes 300', with the upper diodes 368' for gate bias at on-state only. At the on-state, all diodes 300' receive sufficiently high voltage and very effectively bias the LDD layers 150/160 into charge carrier accumulation. This embodiment again allows fewer diode types to be used. This cascaded upper diode 368' arrangement can also be applied to the cases of FIG. 9 of unidirectional diodes 300.

Only a few examples and implementations are described. Other implementations, variations, modifications and enhancements to the described examples and implementations may be made without deviating from the spirit of the present invention. For example, the P-type high voltage power MOSFET can be implemented by reversing the doping polarities of the semiconductor substrate, the body region, the source, the drain region and the drain layers from the examples disclosed above. The examples disclosed are also suitable for high voltage power MOSFET of various semiconductor materials. Moreover, vertical and lateral high voltage power MOSFETs, with three dimensional voltage regulating layers, can be achieved by other means from the exemplified implementations described.

What is claimed is:

1. A high voltage power MOSFET, comprising:
   a semiconductor substrate doped by a first conducting type;
   a source doped by a second conducting type and over the semiconductor substrate;
   a drain region doped by the second conducting type and on the semiconductor substrate;
   one or more drain layers doped by the second conducting type and on the semiconductor substrate, wherein the one or more drain layers span between the body region and the drain region, wherein doping levels in the source and in the drain region are at least an order of magnitude higher than doping levels in the body region and the one or more drain layers;
   a body region doped by the first conducting type and configured to separate the source from the one or more drain layers and the drain region;
   an insulating layer formed on at least a portion of the body region and over the one or more drain layers;
   a voltage regulating layer on the insulating layer and configured to produce voltage distributions in the one or more drain layers to deplete charge carriers to increase blockage voltage in an off state, and to accumulate charge carriers in an on state to reduce on-state resistance, wherein the voltage regulating layer includes a layer of serially connected P-N junctions which includes multiple pairs of P-N junctions connected back-to-back, wherein the layer of serially connected P-N junctions includes a first end electrically connected with the source and a second end electrically connected with the drain region; and a gate on the insulating layer and at least in part over the source.

2. The high voltage power MOSFET of claim 1, wherein doping levels in the source and in the drain region are at least two orders of magnitude higher than doping levels in the body region and the one or more drain layers.

3. The high voltage power MOSFET of claim 1, wherein doping levels in the source and in the drain region are at least an order of magnitude higher than doping levels in the semiconductor substrate.

4. A high voltage power MOSFET, comprising:
a semiconductor substrate doped by a first conducting type;
a source doped by a second conducting type and over the semiconductor substrate;
a drain region doped by the second conducting type and on the semiconductor substrate;
one or more drain layers doped by the second conducting type and on the semiconductor substrate, wherein the one or more drain layers span between the body region and the drain region, wherein doping levels in the source and in the drain region are at least an order of magnitude higher than doping levels in the body region and the one or more drain layers;
a body region doped by the first conducting type and configured to separate the source from the one or more drain layers and the drain region;
an insulating layer formed on at least a portion of the body region and over the one or more drain layers;
a voltage regulating layer on the insulating layer and configured to produce voltage distributions in the one or more drain layers to deplete charge carriers to increase blockage voltage in an off state, and to accumulate charge carriers in an on state to reduce on-state resistance, wherein the voltage regulating layer includes a layer of serially connected P-N junctions, wherein the layer of serially connected P-N junctions includes multiple serially connected uni-directional P-N junctions; and
a gate on the insulating layer and at least in part over the source.

5. The high voltage power MOSFET of claim 4, wherein the layer of serially connected P-N junctions includes a first end electrically connected with the gate and a second end, the high voltage power MOSFET further comprising:
a P-N junction diode connected between the second end of the layer of serially connected P-N junctions and the drain region.

6. The high voltage power MOSFET of claim 4, wherein doping levels in the source and in the drain region are at least two orders of magnitude higher than doping levels in the body region and the one or more drain layers.

7. A high voltage power MOSFET, comprising:
a semiconductor substrate doped by a first conducting type;
a source doped by a second conducting type and over the semiconductor substrate;
a drain region doped by the second conducting type and on the semiconductor substrate;
one or more drain layers doped by the second conducting type and on the semiconductor substrate, wherein the one or more drain layers span between the body region and the drain region, wherein doping levels in the source and in the drain region are at least an order of magnitude higher than doping levels in the body region and the one or more drain layers;
a body region doped by the first conducting type and configured to separate the source from the one or more drain layers and the drain region;
an insulating layer formed on at least a portion of the body region and over the one or more drain layers;
a voltage regulating layer on the insulating layer and configured to produce voltage distributions in the one or more drain layers to deplete charge carriers to increase blockage voltage in an off state, and to accumulate charge carriers in an on state to reduce on-state resistance, wherein the voltage regulating layer includes a layer of serially connected P-N junctions; and
a gate on the insulating layer and at least in part over the source,
wherein the voltage regulating layer includes a first layer of serially connected P-N junctions,
the high voltage power MOSFET further comprising:
one or more second layers of serially connected P-N junctions connected in parallel to the first layer of serially connected P-N junctions,
wherein the first layer of serially connected P-N junctions and the one or more second layers of serially connected P-N junctions are configured to produce voltage distributions in the one or more drain layers to deplete charge carriers to increase blockage voltage in an off state, and to accumulate charge carriers in an on state to reduce on-state resistance.

8. The high voltage power MOSFET of claim 7, wherein the voltage regulating layer includes a layer of at least two serially connected P-N junctions that are connected in parallel with each other,
wherein the at least two serially connected P-N junctions are configured to produce voltage distributions in the one or more drain layers to deplete charge carriers to increase blockage voltage in an off state, and to accumulate charge carriers in an on state to reduce on-state resistance.

9. The high voltage power MOSFET of claim 8, wherein each of the at least two serially connected P-N junctions comprises multiple serially connected uni-directional P-N junctions.

10. The high voltage power MOSFET of claim 8, wherein each of the at least two serially connected P-N junctions comprises multiple pairs of P-N junctions connected back-to-back.

11. The high voltage power MOSFET of claim 8, wherein the first conducting type is P type, wherein the second conducting type is N type, wherein the high voltage power MOSFET is a high voltage N-type power MOSFET.

12. The high voltage power MOSFET of claim 8, wherein the first conducting type is N type, wherein the second conducting type is P type, wherein the high voltage power MOSFET is a high voltage P-type power MOSFET.

13. The high voltage power MOSFET of claim 7, wherein doping levels in the source and in the drain region are at least two orders of magnitude higher than doping levels in the body region and the one or more drain layers.

* * * * *